(12) United States Patent
Kim

(10) Patent No.: US 8,923,080 B2
(45) Date of Patent: Dec. 30, 2014

(54) PERIOD SIGNAL GENERATION CIRCUIT

(71) Applicant: SK Hynix Inc., Icheon (KR)

(72) Inventor: Dong Kyun Kim, Cheongju-si (KR)

(73) Assignee: SK Hynix Inc., Icheon (KR)

( * ) Notice: Subject to any disclaimer, the term of this patent is extended or adjusted under 35 U.S.C. 154(b) by 87 days.

(21) Appl. No.: 13/716,028

(22) Filed: Dec. 14, 2012

(65) Prior Publication Data

US 2013/0315008 A1  Nov. 28, 2013

(30) Foreign Application Priority Data

May 25, 2012 (KR) .................. 10-2012-0056370

(51) Int. Cl.
*G11C 7/00* (2006.01)
*G11C 7/04* (2006.01)
*G11C 5/14* (2006.01)
*G11C 5/00* (2006.01)
*G11C 11/406* (2006.01)

(52) U.S. Cl.
CPC *G11C 5/147* (2013.01); *G11C 7/00* (2013.01); *G11C 5/005* (2013.01); *G11C 11/40615* (2013.01); *G11C 11/40626* (2013.01)
USPC .................. 365/191; 365/212; 365/222

(58) Field of Classification Search
USPC ............................................. 365/191
See application file for complete search history.

(56) References Cited

U.S. PATENT DOCUMENTS

| | | | |
|---|---|---|---|
| 5,499,214 A * | 3/1996 | Mori et al. | 365/222 |
| 5,774,404 A * | 6/1998 | Eto | 365/222 |
| 6,998,901 B2 * | 2/2006 | Lee | 327/536 |
| 7,538,619 B2 * | 5/2009 | Kim | 331/1 A |
| 7,646,661 B2 * | 1/2010 | Koga et al. | 365/222 |
| 8,054,141 B2 | 11/2011 | Saw | |
| 8,076,984 B2 * | 12/2011 | Song et al. | 331/176 |

FOREIGN PATENT DOCUMENTS

KR  1020080066249 A  7/2008

* cited by examiner

*Primary Examiner* — Son Mai

(57) ABSTRACT

A period signal generation circuit includes a first discharger configured to discharge first current having a constant value from a control node in response to a temperature signal; and a second discharger configured to discharge second current varying according to an internal temperature thereof from the control node in response to the temperature signal.

25 Claims, 7 Drawing Sheets

PERIOD SIGNAL GENERATION CIRCUIT

CROSS-REFERENCE TO RELATED APPLICATION

The present application claims priority under 35 U.S.C 119(a) to Korean Patent Application No. 10-2012-0056370, filed on May 25, 2012 in the Korean Intellectual Property Office, which is incorporated herein by reference in its entirety set forth in full.

BACKGROUND

In general, semiconductor memory devices may be categorized as either volatile or nonvolatile memory devices. While the volatile memory devices lose their stored data when power is interrupted, the nonvolatile memory devices retain their stored data even when power is interrupted. Volatile memory devices include dynamic random access memory (DRAM) devices and static random access memory (SRAM) devices. A unit cell of the SRAM devices may include a flip flop circuit (e.g., two cross-coupled inverters) and two switching elements. Thus, the SRAM cells may stably store their data as long as power is supplied. Meanwhile, a unit cell of the DRAM devices may include a cell transistor acting as a switching element and a cell capacitor acting as a data storage element. If the cell transistor is turned on, the cell capacitor will be charged through the cell transistor to store a data bit in the capacitor.

In the DRAM devices, leakage currents may occur through the cell transistors even though the cell transistors are turned off. Thus, the data (e.g., charges) stored in the capacitors may be lost as the time elapses. Thus, the cell capacitors need to be periodically recharged to retain their stored data.

The refresh operation may be categorized as either an auto-refresh operation or a self-refresh operation. The auto-refresh operation may be executed by refresh commands outputted from a memory controller, and the self-refresh operation may be executed by self-refresh signals which are internally generated in the DRAM devices.

The self-refresh operation may be periodically executed according to a refresh cycle time determined in the DRAM devices. The refresh cycle time may be determined by a data retention time corresponding to a maximum time that the cell capacitors can retain a minimum charge which is required to read a correct logic data. The data retention time may be influenced by leakage current characteristics of the cell transistors and the leakage current characteristics of the cell transistors may vary according to an internal temperature of the DRAM devices. Thus, the data retention time may be affected by the internal temperature of the DRAM devices.

As leakage currents increase with an increase of the internal temperature of the DRAM devices, the data retention time decreases with the increase of the internal temperature, and vice versa. Thus, a refresh circuit should be designed such that the refresh cycle time varies according to an internal temperature of the DRAM devices. That is, the refresh cycle time should be reduced to ensure successful operations of the DRAM device as the internal temperature of the DRAM device increases. On the other hand, the refresh cycle time should be increased to reduce the power consumption of the DRAM device as the internal temperature of the DRAM device decreases. Conventional DRAM devices include period signal generation circuits to control the refresh cycle time according to the internal temperature thereof.

FIG. 1 is a block diagram illustrating a conventional period signal generation circuit.

As illustrated in FIG. 1, the conventional period signal generation circuit includes a first oscillator 11, a second oscillator 12, a temperature sensor 13 and a selection output unit 14. The first oscillator 11 generates a first oscillating signal OSC1 having a steady period (e.g., a constant cycle time) regardless of an internal temperature of the period signal generation circuit. The second oscillator 12 generates a second oscillating signal OSC2 whose period varies according to the internal temperature. The temperature sensor 13 generates a temperature signal TS which transitions from one level to another level at a predetermined temperature. The selection output unit 14 receives the first and second oscillating signals OSC1 and OSC2 in response to the temperature signal TS and outputs a period signal PSRF. The selection output unit 14 outputs the first oscillating signal OSC1 as the period signal PSRF when the temperature signal TS is generated at a temperature below the predetermined temperature. On the other hand, the selection output unit 14 outputs the second oscillating signal OSC2 as the period signal PSRF when the temperature signal TS is generated at a temperature over the predetermined temperature.

As described above, the period signal PSRF outputted from the conventional period signal generation circuit uses the first oscillating signal OSC1 at a temperature below the predetermined temperature, and the second oscillating signal OSC2 at a temperature over the predetermined temperature. Thus, if a refresh cycle time is determined by the period signal PSRF, the refresh cycle time may be uniform or constant at a temperature below the predetermined temperature and the refresh cycle time may vary with temperature when the temperature is higher than the predetermined temperature.

The selection output unit 14 may function as a comparator. That is, the selection output unit 14 may compare the period of the first oscillating signal OSC1 with the period of the second oscillating signal OSC2 in response to the temperature signal TS and may output any one of the first and second oscillating signals OSC1 and OSC2 as the period signal PSRF. Thus, the conventional period signal generation circuit requires two oscillators continuously generating oscillating signals with different characteristics. Moreover, when a difference between the periods of the first and second oscillating signals OSC1 and OSC2 is small, the selection output unit 14 acting as a comparator may malfunction and output a wrong oscillating signal.

SUMMARY

An embodiment of the present invention relates to a period signal generation circuit including a control node, a first discharger, a second discharger, and an output node. The first discharger is coupled to the control node and configured to discharge generate a first current having a substantially constant value from a control node in response to a temperature signal. The second discharger is coupled to the control node and configured to discharge generate a second current that varies varying according to an internal temperature thereof from the control node in response to the temperature signal. The output node is configured to output a period signal having a period that varies according the first current and the second current generated by the first discharger and second discharger, respectively. In an implementation, the period signal generation circuit is part of a semiconductor memory device and the period signal is used to refresh memory cells in the semiconductor memory device. In an implementation, the semiconductor memory device is provided in a package and the internal temperature corresponds to a temperature within the package.

In an embodiment, a period signal generation circuit includes a first discharger configured to discharge first current having a constant value from a control node in response to a temperature signal, and a second discharger configured to discharge second current varying according to an internal temperature thereof from the control node in response to the temperature signal.

In another embodiment, a period signal generation circuit includes a comparator configured to compare a voltage of a control node with a first reference voltage to generate a comparison signal, a driver configured to pull up the voltage of control node to a power supply voltage in response to the comparison signal, and a discharge unit configured to discharge first current having a constant value from a control node or discharge second current varying according to an internal temperature thereof from the control node, in response to a temperature signal.

BRIEF DESCRIPTION OF THE DRAWINGS

Embodiments of the present invention will become more apparent in view of the attached drawings and accompanying detailed description.

DESCRIPTION OF SPECIFIC EMBODIMENTS

Embodiments of the present invention will be described hereinafter with reference to the accompanying drawings. However, the embodiments described herein are for illustrative purposes only and are not intended to limit the scope of the present invention.

Figure 1:
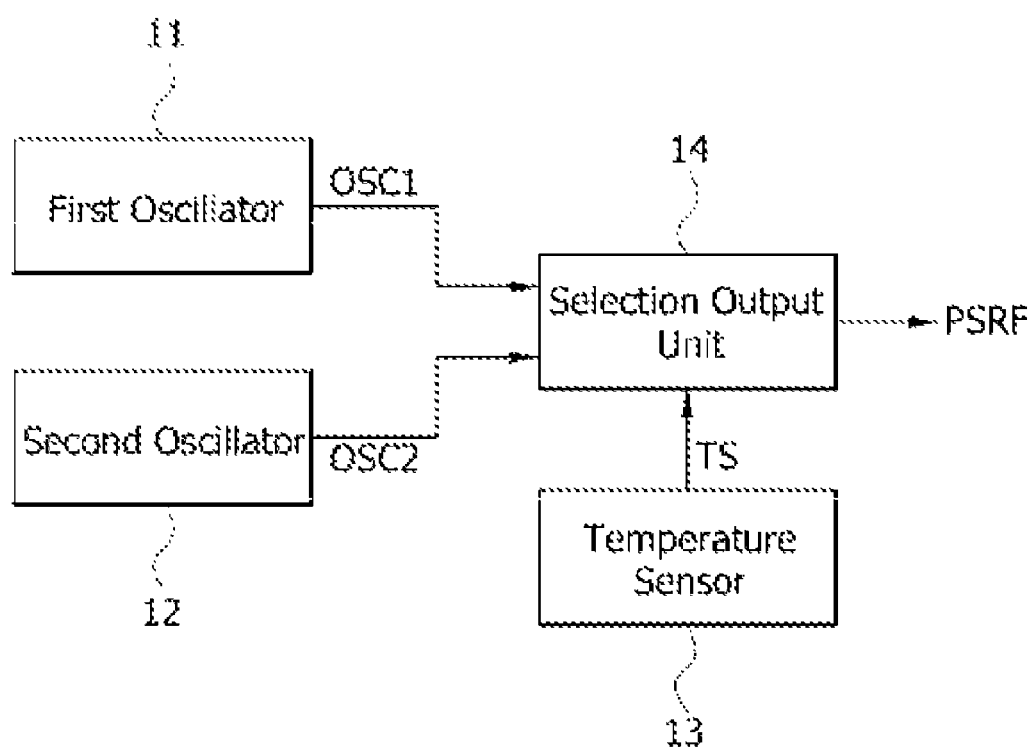
FIG. 1 is a block diagram illustrating a conventional period signal generation circuit.
Figure 2:
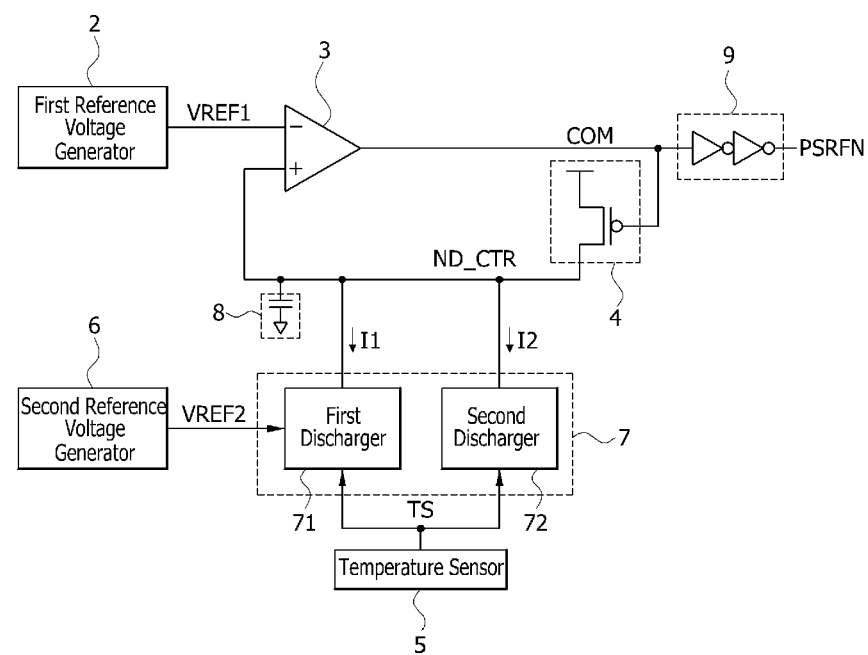
FIG. 2 illustrates a configuration of a period signal generation circuit according to an embodiment of the present invention.

FIG. 2 illustrates a configuration of a period signal generation circuit according to an embodiment of the present invention.

As illustrated in FIG. 2, the period signal generation circuit may be configured to include a first reference voltage generator 2, a comparator 3, a driver 4, a temperature sensor 5, a second reference voltage generator 6, a discharge unit 7, a stabilizer 8, and a buffer 9.

The first reference voltage generator 2 may generate a first reference voltage signal VREF1 having a first reference voltage with a constant voltage level. The comparator 3 may compare a signal (e.g., a voltage signal) induced at a control node ND_CTR with the first reference voltage signal VREF1 to generate a comparison signal COM. The temperature sensor 5 may generate a temperature signal TS. The temperature signal TS may have a logic "high" state when an internal temperature of the refresh circuit is below a predetermined temperature (e.g., 45 degrees Celsius) and may have a logic "low" state when the internal temperature of the refresh circuit is equal to or greater than the predetermined temperature. The second reference voltage generator 6 may generate a second reference voltage signal VREF2 having a constant voltage level regardless of a variation in the internal temperature or a variable voltage level that linearly varies according to a variation in the internal temperature. The stabilizer 8 is configured to stabilize the voltage of the control node ND_CTR. In an embodiment, the stabilizer 8 includes a capacitor which is charged by the control node ND_CTR. The buffer 9 is configured to buffer the comparison signal COM and generate a period signal PSRFN. The buffer 9 may be a plurality of inverters and/or other components suitable for buffering and generating the period signal PSRFN.

In an embodiment, the comparison signal COM is enabled initially to have a logic "low" state when the voltage of the control node ND_CTR has a lower level than the first reference voltage signal VREF1. Accordingly, a periodic signal PSRFN is in a logic "low" state. The driver 4 receives the comparison signal COM having a logic "low" state to turn on the PMOS in the driver 4 for pulling up the voltage of the control node ND_CTR to a power supply voltage. As a result, the comparison signal COM is enabled to have a logic "high" state and the periodic signal PSRFN having a logic "high" state is outputted. The PMOS of the driver 4 receives the logic "high" state and is turned off. The voltage of the control node ND_CTR is decreased until the voltage ND_CTR has a lower level than the first reference voltage signal VREF1, due to discharged currents from the control node ND_CTR as described below. Then, the comparison signal COM is enabled to have the logic "low" state once again. The periodic signals PSRFN of "high" and "low" signals are generated in this manner.

The discharge unit 7 is configured to discharge the charges stored in the control node ND_CTR as needed. In an embodiment, the discharger unit 7 includes a first discharger 71 and a second discharger 72. The first discharger 71 may generate a first current I1 which is discharged from the control node ND_CTR in response to the second reference voltage signal VREF2. The first current I1 may flow through the first discharger 71 and may have a constant current level regardless of a variation in the internal temperature. The second discharger 72 may generate a second current I2 which is discharged from the control node ND_CTR. The second current I2 may flow through the second discharger 72 and may have a variable current level which is nonlinearly increased as the internal temperature increases.

In an operation, one of the first and second dischargers 71 and 72 may selectively operate according to the temperature signal TS to discharge the charges stored in the control node ND_CTR. That is, when the temperature signal TS has a logic "high" state (e.g., when the internal temperature is below 45 degrees Celsius), the first discharger 71 may operate to generate the first current I1 from the control node ND_CTR. On the other hand, when the temperature signal TS has a logic "low" state (e.g., when the internal temperature is equal to or greater than 45 degrees Celsius), the second discharger 72 may operate to generate the second current I2 from the control node ND_CTR.

Hereafter, configurations of the second reference voltage generator 6, the first discharger 71 and the second discharger 72 will be described more fully with reference to FIGS. 3, 4 and 5.

Figure 3:
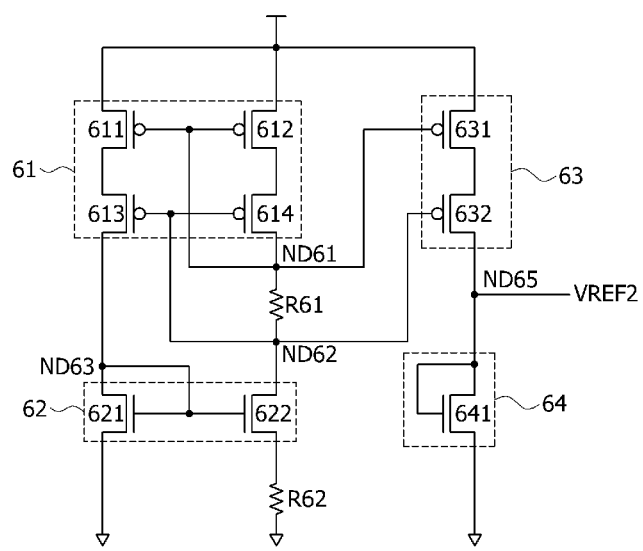
FIG. 3 is a circuit diagram illustrating a second reference voltage generator included in a period signal generation circuit shown in FIG. 2 according to an embodiment of the present invention.

As illustrated in FIG. 3, the second reference voltage generator 6 may be configured to include a first current source 61, a second current source 62, a reference voltage driver 63, a linearity controller 64, and resistors R61 and R62. The first current source 61 may operate as a constant current source in response to a voltage of a node ND61 and a voltage of a node ND62, thereby supplying charges to the node ND61. In an embodiment, the first current source 61 includes two sets of two PMOS transistors connected in series. The node ND61 and the node ND62 are electrically connected to a gate of the upper PMOS transistors 611 and 612 and of the lower PMOS transistors 613 and 614 of each set, respectively.

The second current source 62 may operate as a constant current source in response to a voltage of a node ND63, thereby discharging the node ND62. In an embodiment, the second current source 62 includes two NMOS resistors 621 and 622. The left NMOS transistor 621 of the second current source 62 is a saturated MOS transistor whose gate is connected to the node ND63. The right NMOS transistor 622 is electronically connected to a ground voltage through the resistor R62. The node ND61 and the node ND62 are electrically connected by the resistor R61.

The reference voltage driver 63 is configured to output the second reference voltage signal VREF2. In an embodiment, the reference voltage driver 63 includes two PMOS transistors connected in series. The linearity controller 64 may be electrically connected to an output node of the reference voltage driver 63. The second reference voltage signal VREF2 may be outputted from a node ND65 between the reference voltage driver 63 and the linearity controller 64, i.e., via the output node of the reference voltage driver 63. In an embodiment, the linearity controller 64 includes a diode element 641 composed of a saturated MOS transistor.

In an operation, the NMOS transistor 622 in the second current source 62 connecting the node ND62 and the resistor R62 may operate in the weak inversion mode and a current flowing through the NMOS transistor 622 may be increased in proportion to the internal temperature. Because a level of the current flowing through the NMOS transistor 622 may be substantially the same as a level of a variable current entering into the output node ND65 of the second reference voltage, the level of the variable current entering into the node ND65 may be also increased in proportion to the internal temperature. The level of the current flowing through the reference voltage driver 63 via the node ND65 may be adjusted by changing the resistor R62 and the beta ratio of the NMOS transistors 621 and 622 in the second current source 62.

On the other hand, a level of the variable current discharged from the output node ND65 of the second reference voltage through the saturated MOS transistor 641 may be increased in proportion to the internal temperature, because the threshold voltage of the saturated MOS transistor 641 is decreased with an increase of the internal temperature. A slope of the variable current discharged from the output node ND65 may be controlled by adjusting a size (e.g., a ratio of a channel width to a channel length) of the saturated MOS transistor 641. As a result, when the levels of the variable currents discharged from and entering into the output node ND65 are substantially equal to each other, a level of the second reference voltage signal VREF2 may be maintained constant regardless of a variation in the internal temperature. When the level of the variable current discharged from the output node ND65 is smaller than that of the variable current entering into the output node ND65, the second reference voltage signal VREF2 outputted from the second reference voltage generator 6 is increased in proportion to the internal temperature, and vice versa. In this way, the second reference voltage signal VREF2 may be generated to have a constant voltage level regardless of the variation in the internal temperature, or a variable voltage level that varies linearly with the internal temperature.

Figure 4:
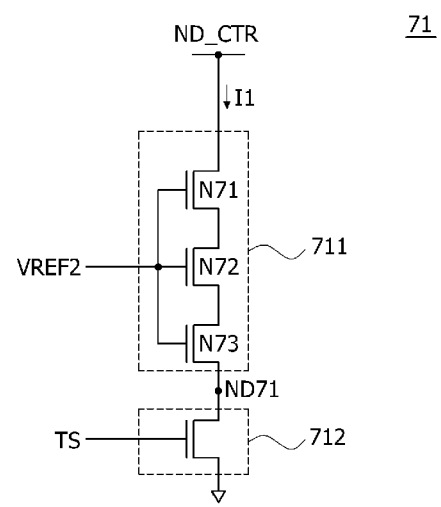
FIG. 4 is a circuit diagram illustrating a first discharger included in a period signal generation circuit shown in FIG. 2 according to an embodiment of the present invention.

FIG. 4 illustrates the first discharger 71 that is configured to generate the first current I1 when the internal temperature is below a predetermined temperature (e.g., 45 degrees Celsius) according to an embodiment of the present invention. The first discharger 71 may be configured to include a switching portion 711 and an activating portion 712. The switching portion 711 may include NMOS transistors N71, N72 and N73 which are turned on when the second reference voltage signal VREF2 is applied to gates of the NMOS transistors N71, N72 and N73. When the second reference voltage signal VREF2 is applied to the gates of the NMOS transistors N71, N72 and N73, charges stored in the control node ND_CTR may be discharged through the NMOS transistors N71, N72 and N73 to generate the first current I1 flowing from the control node ND_CTR towards a node ND71. When the temperature signal TS has a logic "high" state representing that the internal temperature is below the predetermined temperature (e.g., 45 degrees Celsius), the activating portion 712 may electrically connect the node ND71 to a ground voltage terminal to activate the operation of the switching portion 711. As a result, the first discharger 71 may generate the first current I1 from the charges discharged from the control node ND_CTR when the internal temperature is below a predetermined temperature.

Figure 5:
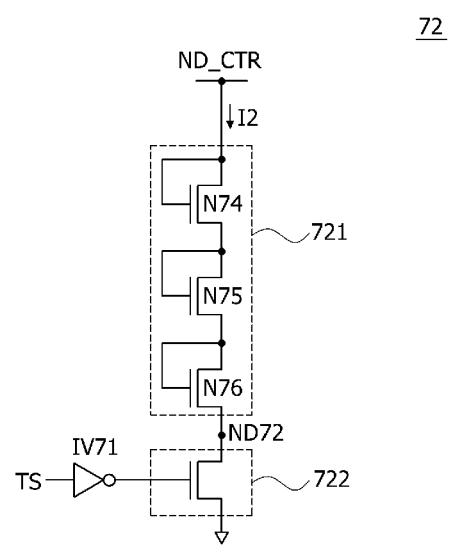
FIG. 5 is a circuit diagram illustrating a second discharger included in a period signal generation circuit shown in FIG. 2 according to an embodiment of the present invention.

FIG. 5 illustrates the second discharger 72 that is configured to generate the second current I2 when the internal temperature is equal to or greater than the predetermined temperature (e.g., 45 degrees Celsius) according to an embodiment of the present invention. The second discharger 72 may be configured to include a diode portion 721 and an activating portion 722. The diode portion 721 may include saturated NMOS transistors N74, N75 and N76 which are serially connected to each other, thereby providing an electrical path connected to the control node ND_CTR. The charges stored in the control node ND_CTR may be discharged through the saturated NMOS transistors N74, N75 and N76 to generate the second current I2 flowing from the control node ND_CTR towards a node ND72 when the temperature signal TS has a logic "low" state representing that the internal temperature is equal to or greater than the predetermined temperature. The activating portion 722 may electrically connect the node ND72 to a ground voltage terminal to activate the operation of the diode portion 721 when the temperature signal TS is "low" since it is converted to "high" by the inverter IV71. That is, the second discharger 72 may generate the second current I2 based on the charges discharged from the control node ND_CTR when the internal temperature is equal to or greater than the predetermined temperature (e.g., 45 degrees Celsius).

Figure 6:
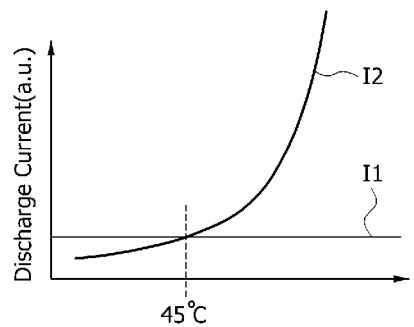
FIG. 6 is a graph illustrating discharge currents of first and second dischargers of FIG. 2 as a function of an internal temperature of a period signal generation circuit shown in FIG. 2 according to an embodiment of the present invention.

Referring to FIG. 6, the first current I1 discharged through the first discharger 71 and the second current I2 discharged through the second discharger 72 may be plotted as a function of the internal temperature. That is, the first current I1 may be constant or uniform regardless of a variation in the internal temperature. However, in some embodiments, the first current I1 may linearly increase or decrease according to a variation in the internal temperature. The second current I2 may be nonlinearly (e.g., exponentially) increased as the internal temperature increases.

Hereinafter, operations of the period signal generation circuit for generating the period signal PSRFN will be described when the internal temperature is below the predetermined temperature (e.g., 45 degrees Celsius) and when the internal temperature is equal to or greater than the predetermined temperature (e.g., 45 degrees Celsius).

Figure 7:
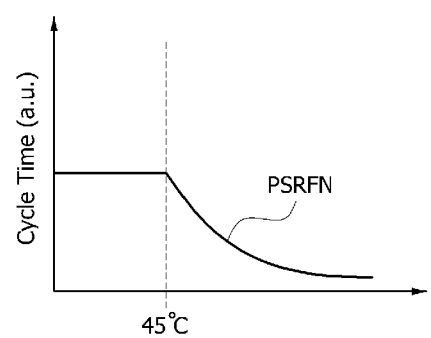
FIG. 7 is a graph illustrating cycle times of a period signal outputted from a period signal generation circuit shown in FIG. 2 as a function of an internal temperature of a period signal generation circuit shown in FIG. 2 according to an embodiment of the present invention.

First, when the internal temperature is below the predetermined temperature (e.g., 45 degrees Celsius), the temperature signal TS may have a logic "high" state. The activating portion 712 of the first discharger 71 is enabled while the activating portion 722 of the second discharger 72 is not enabled. In such a case, the control node ND_CTR may be charged by the activation of the driver 4 (see FIG. 2) if the voltage of the control node ND_CTR is lower than the first reference voltage (a voltage of the first reference voltage signal VREF1) and may be discharged by the activation of the first discharger 71 if the voltage of the control node ND_CTR is higher than the first reference voltage (a voltage of the first reference voltage signal VREF1). Since the first current I1 flowing through the first discharger 71 is constant when the internal temperature is below the predetermined temperature, a level transition period of the comparison signal COM may be constant. Accordingly, the period (e.g., a cycle time) of the period signal PSRFN may be constant when the internal temperature is below the predetermined temperature (e.g., 45 degrees Celsius), as illustrated in FIG. 7.

Next, when the internal temperature is equal to or greater than the predetermined temperature (e.g., 45 degrees Celsius), the temperature signal TS may have a logic "low" state. The activating portion 722 of the second discharger 72 is enabled while the activating portion 712 of the first discharger 71 is not enabled. In such a case, the control node ND_CTR may be charged by the activation of the driver 4 if the voltage of the control node ND_CTR is lower than the first reference voltage (a voltage of the first reference voltage signal VREF1), and may be discharged by the activation of the second discharger 72 if the voltage of the control node ND_CTR is higher than the first reference voltage (a voltage of the first reference voltage signal VREF1). The second current I2 flowing through the second discharger 72 may be nonlinearly (e.g., exponentially) increased as the internal temperature increases over the predetermined temperature. Thus, a level transition period of the comparison signal COM may be nonlinearly reduced as the internal temperature increases over the predetermined temperature. Therefore, the period (e.g., a cycle time) of the period signal PSRFN may be nonlinearly reduced as the internal temperature increases over the predetermined temperature (e.g., 45 degrees Celsius), as illustrated in FIG. 7.

The period signal PSRFN generated by the period signal generation circuit described above may be used not only in the case of setting a self refresh period but also in various circuits which need a periodic operation. Since the period signal generation circuit according to an embodiment of the present invention does not use circuits for generating a plurality of oscillation signals and circuits for comparing the plurality of oscillation signals, the simplified period signal generation circuit may be realized while occupying a small area. In addition, since the period signal generation circuit according to an embodiment of the present invention does not perform operations for comparing the plurality of oscillation signals, a stable operation of the period signal generation circuit may be ensured by preventing the occurrence of a malfunction resulted from comparison of the plurality of oscillation signals with similar periods.

The embodiments of the present invention have been disclosed above for illustrative purposes. Those skilled in the art will appreciate that various modifications, additions and substitutions are possible, without departing from the scope and spirit of the present invention as disclosed in the accompanying claims.

What is claimed is:

1. A period signal generation circuit comprising:
    a control node;
    a first discharger coupled to the control node and configured to generate a first current having a substantially constant value in response to a temperature signal; and
    a second discharger coupled to the control node and configured to generate a second current that varies according to an internal temperature thereof in response to the temperature signal; and
    an output node configured to output a period signal having a period that varies according the first current and the second current generated by the first discharger and second discharger, respectively.

2. The period signal generation circuit of claim 1, wherein the period signal generation circuit is part of a semiconductor memory device and the period signal is used to refresh memory cells in the semiconductor memory device.

3. The period signal generation circuit of claim 2, wherein the semiconductor memory device is provided in a package and the internal temperature corresponds to a temperature within the package.

4. The period signal generation circuit according to claim 1, wherein the control node is pulled up to have a voltage corresponding to a power supply voltage when the control node has a lower voltage level than a first reference voltage.

5. The period signal generation circuit according to claim 1, wherein the period signal generation circuit is provided in a package and the internal temperature corresponds to a temperature within the package,
    wherein the temperature signal is generated based on the internal temperature of the package,
    wherein the first and second dischargers are configured to be selectively enabled in response to the temperature signal that transitions from one level to another level when the internal temperature reaches a predetermined temperature.

6. The period signal generation circuit according to claim 1, wherein the second current is nonlinearly increased as the internal temperature increases.

7. The period signal generation circuit according to claim 1, wherein the first discharger comprises:
    a switching portion configured to be turned on in response to a second reference voltage signal to generate the first current based on charges discharged from the control node; and
    an activating portion configured to activate the switching portion in response to the temperature signal.

8. The period signal generation circuit according to claim 7, wherein the switching portion of the first discharger includes at least one MOS transistor which is turned on when the second reference voltage signal is applied to a gate of the at least one MOS transistor.

9. The period signal generation circuit according to claim 7, wherein the second reference voltage signal has a substantially constant voltage level regardless of the variation of the internal temperature or a variable voltage level that linearly varies with the internal temperature.

10. The period signal generation circuit according to claim 9, further comprising a reference voltage generator for generating the second reference voltage signal, wherein the reference voltage generator includes:

a first resistor connecting a first node to a second node;

a first current source operating as a substantially constant current source in response to voltages of the first and second nodes;

a second current source connected to the second node to operate as a substantially constant current source in response to a voltage of a third node;

a second resistor connected to the second current source;

a reference voltage driver for driving the second reference voltage signal in response to the voltages of the first and second nodes; and a linearity controller electrically connected to an output node of the reference voltage driver, wherein the second reference voltage signal is outputted through the output node of the reference voltage driver.

11. The period signal generation circuit according to claim 1, wherein the second discharger comprises:

a diode portion configured to have at least one diode element to generate the second current discharged from the control node; and an activating portion configured to activate the diode portion in response to the temperature signal.

12. The period signal generation circuit according to claim 4, further comprising:

a comparator configured to compare the voltage of the control node with the first reference voltage to generate a comparison signal; and a driver configured to pull up the voltage of the control node to the power supply voltage in response to the comparison signal, wherein the period signal generation circuit is part of a dynamic random access memory (DRAM) device and the period signal is used to refresh memory cells in the DRAM device.

13. The period signal generation circuit according to claim 1, further comprising:

a stabilizer configured to stabilize the voltage of the control node.

14. A period signal generation circuit comprising:

a comparator configured to compare a voltage of a control node with a first reference voltage to generate a comparison signal;

a driver configured to pull up the voltage of the control node to a power supply voltage in response to the comparison signal;

a discharge unit configured to discharge a first current having a substantially constant value from the control node or discharge a second current varying according to an internal temperature thereof from the control node, in response to a temperature signal; and an output node configured to output a period signal having a period that varies according the first current and the second current.

15. The period signal generation circuit of claim 14, wherein the period signal generation circuit is part of a semiconductor memory device and the period signal is used to refresh memory cells in the semiconductor memory device.

16. The period signal generation circuit of clam 15, wherein the semiconductor memory device is provided in a package and the internal temperature corresponds to a temperature within the package.

17. The period signal generation circuit according to claim 14, wherein the discharge unit comprises:

a first discharger configured to discharge the first current from the control node in response to the temperature signal; and a second discharger configured to discharge the second current from the control node in response to the temperature signal.

18. The period signal generation circuit according to claim 17, wherein the first and second dischargers are configured to be selectively enabled in response to the temperature signal which transitions from one level to another level when the internal temperature reaches a predetermined temperature.

19. The period signal generation circuit according to claim 14, wherein the second current is nonlinearly increased as the internal temperature increases.

20. The period signal generation circuit according to claim 17, wherein the first discharger comprises:

a switching portion configured to be turned on in response to a second reference voltage signal to generate the first current based on charges discharged from the control node; and an activating portion configured to activate the switching portion in response to the temperature signal.

21. The period signal generation circuit according to claim 20, wherein the switching portion of the first discharger includes at least one MOS transistor which is turned on when the second reference voltage signal is applied to a gate of the at least one MOS transistor.

22. The period signal generation circuit according to claim 20, wherein the second reference voltage signal has a substantially constant voltage level regardless of the variation of the internal temperature or a variable voltage level that linearly varies with the internal temperature.

23. The period signal generation circuit according to claim 22, further comprising a reference voltage generator for generating the second reference voltage signal, wherein the reference voltage generator includes:

a first resistor connecting a first node to a second node;

a first current source operating as a substantially constant current source in response to voltages of the first and second nodes;

a second current source connected to the second node to operate as a substantially constant current source in response to a voltage of a third node;

a second resistor connected to the second current source;

a reference voltage driver for driving the second reference voltage signal in response to the voltages of the first and second nodes; and a linearity controller electrically connected to an output node of the reference voltage driver, wherein the second reference voltage signal is outputted through the output node of the reference voltage driver.

24. The period signal generation circuit according to claim 17, wherein the second discharger comprises:

a diode portion configured to have at least one diode element to generate the second current discharged from the control node; and an activating portion configured to activate the diode portion in response to the temperature signal.

25. The period signal generation circuit according to claim 14, further comprising:

a stabilizer configured to stabilize the voltage of the control node.

* * * * *